United States Patent [19]

Goss

[11] 4,394,795

[45] Jul. 26, 1983

[54] CONNECTOR INSERTION TOOL

[75] Inventor: Ralph R. Goss, Hershey, Pa.

[73] Assignee: AMP Incorporated, Harrisburg, Pa.

[21] Appl. No.: 263,377

[22] Filed: May 13, 1981

[51] Int. Cl.$^{3}$ .................................................. H05K 3/30

[52] U.S. Cl. ........................................ 29/739; 29/747; 29/758

[58] Field of Search .................. 29/739, 741, 747, 758, 29/764, 278, 837, 838, 845

[56] References Cited

U.S. PATENT DOCUMENTS 4,089,104 5/1978 Barry et al. ........................ 29/739 X 4,279,072 7/1981 Maurer ............................. 29/758 X 4,316,321 2/1982 Wickham .......................... 29/739 X

*Primary Examiner*—Carl E. Hall

*Attorney, Agent, or Firm*—Allan B. Osborne

[57] ABSTRACT

The disclosed invention is a tool which may be used to mount a connector onto a printed circuit board. The tool is composed of one or more units with each unit consisting of a housing, two rows of push pins, and a retaining bar. The tool is placed into the connector with the push pins bearing on shoulders on the contacts within the connector. The force exerted on the tool drives the depending contact pins into the plated through holes in the circuit board.

1 Claim, 8 Drawing Figures

CONNECTOR INSERTION TOOL

BACKGROUND OF THE INVENTION

The Field of the Invention

The invention disclosed herein falls in the art of pressing contact pins into plated-through holes in printed circuit boards where the required pressing force is substantial.

SUMMARY OF THE INVENTION

The preferred embodiment of the invention disclosed herein includes a housing of a rigid material in which two rows of aligned apertures extend upwardly into the body from the under surface. These apertures are spaced apart in a predetermined spacing to coincide with the contact spacing in the connector. A slot extends horizontally through the housing, intersecting each of the apertures. Rigid push pins are loaded into the apertures and retained therein by a retaining bar received in the horizontal slot. The push pins extend downwardly to abut upwardly facing shoulders on the contacts. A force exerted on the tool drives the contact pins into tight fitting holes in a printed circuit board.

DESCRIPTION OF THE INVENTION

Figure 1:
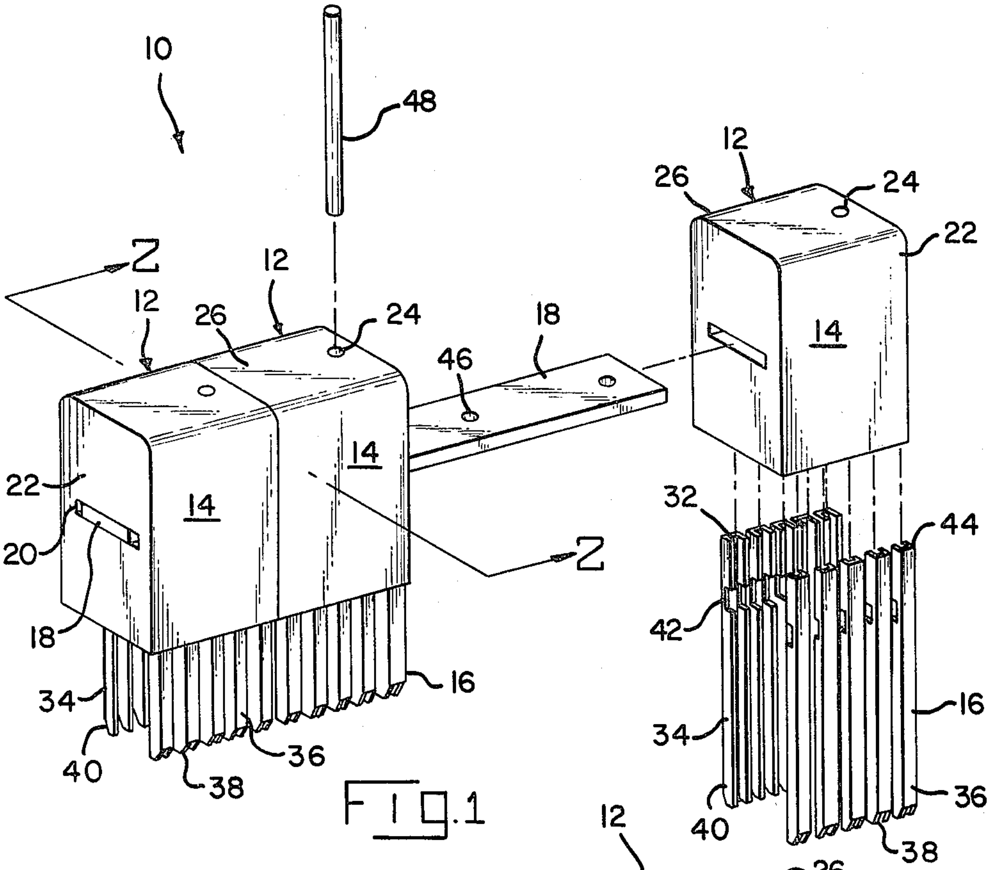
FIG. 1 shows the tool, constructed in accordance with the concepts of the invention, in perspective and in exploded fashion.
Figure 2:
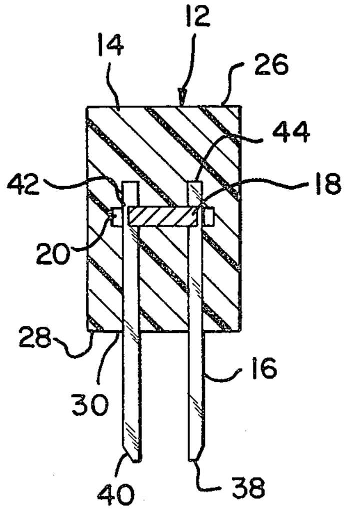
FIG. 2 is a cross-sectional view taken along line 2—2 in FIG. 1.
Figure 6:
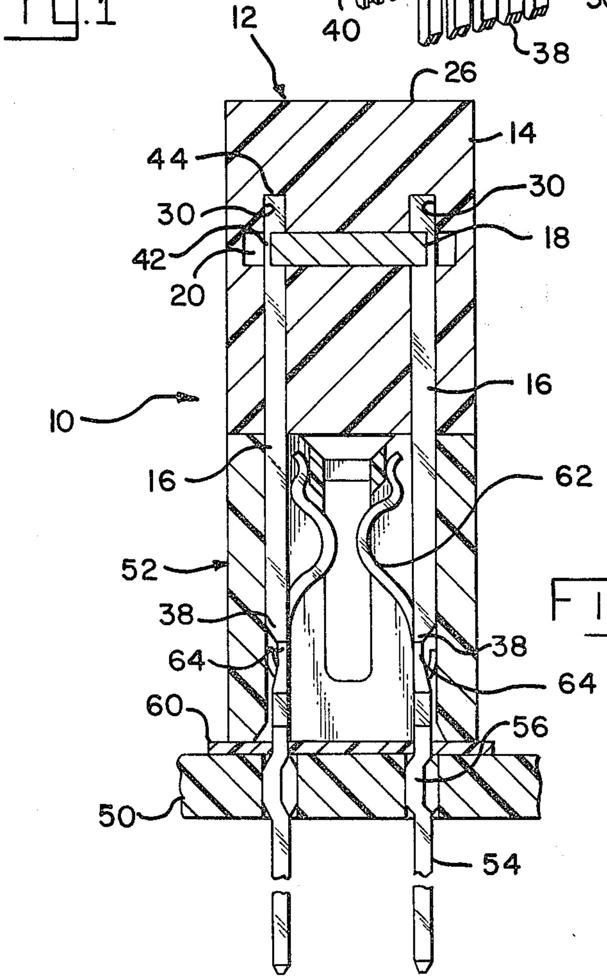
FIG. 6 is a cross-sectional view taken along line 6—6 in FIG. 5.

The construction of connector insertion tool 10 will be described with specific reference to FIGS. 1, 2, and 6. The tool may consist of one or more modules 12. Each module includes a housing 14 and push pins 16. Further, it may include a retaining bar 18 or it may share such a bar with other modules.

Housing 14, preferably made from plastic, has a horizontal slot 20 extending therethrough and opening out on the faces of both ends 22. A vertical hole 24, located adjacent one end 22, extends from the top surface 26 downwardly, through the under surface 28 of the housing. The hole intersects slot 20.

Two rows of spaced apart apertures 30 extend upwardly into the housing, from under surface 28. These apertures intersect slot 20 and stop shortly above it.

Push pins 16 are made from steel and heat treated. Each pin is U-shaped to define a channel 32. The sidewalls 34 extend past floor 36 at the lower end 38 of the pin. The ends of the sidewall at the lower end are bevelled as indicated by reference numeral 40. Notches 42 are cut into each sidewall near the upper end 44 of the pins.

Retaining bar 18, made from flat stock of steel and heat treated, has a predetermined width and a hole or holes 46 depending on its length.

Tool 10 is assembled by inserting push pins 16 in to the apertures, upper end first and with notches 42 facing inwardly. With the pins in place, bar 18 is slid into slot 20 and through notches 42. FIGS. 2 and 6 show the relation of the bar to the push pins which retains the pins in the housing. A roll pin 48 is inserted into hole 24 in the housing and through hole 46 in the bar to retain the bar in the housing.

As noted above, tool 10 may consist of one module 12 or any number of modules. FIG. 1 shows a bar 18 designed for a tool having four modules, arranged on the bar end to end. The length of the connectors with which the tool will be used determines the number of modules required and the length of bar 18.

The use of tool 10 will be described with reference to FIGS. 3 through 6.

The connector to be mounted on circuit board 50 is indicated in the Figures by reference numeral 52. This is a circuit card edge connector sold by AMP Incorporated of Harrisburg, Pa. under the trade name AMP PACE connector. It carries a number of contacts having pins 54 depending therefrom. Each pin includes a spring section 56 which is so designed as to require a considerable amount of force in entering a plated-through hole 58 in board 50. The mylar strip 60 near the tips of pins 54 keeps them in alignment during insertion into the board. Further, each contact has a circuit card-engaging member 62 and two upwardly facing shoulders 64 located on each side of member 62. FIG. 6 shows these structural members.

Figure 3:
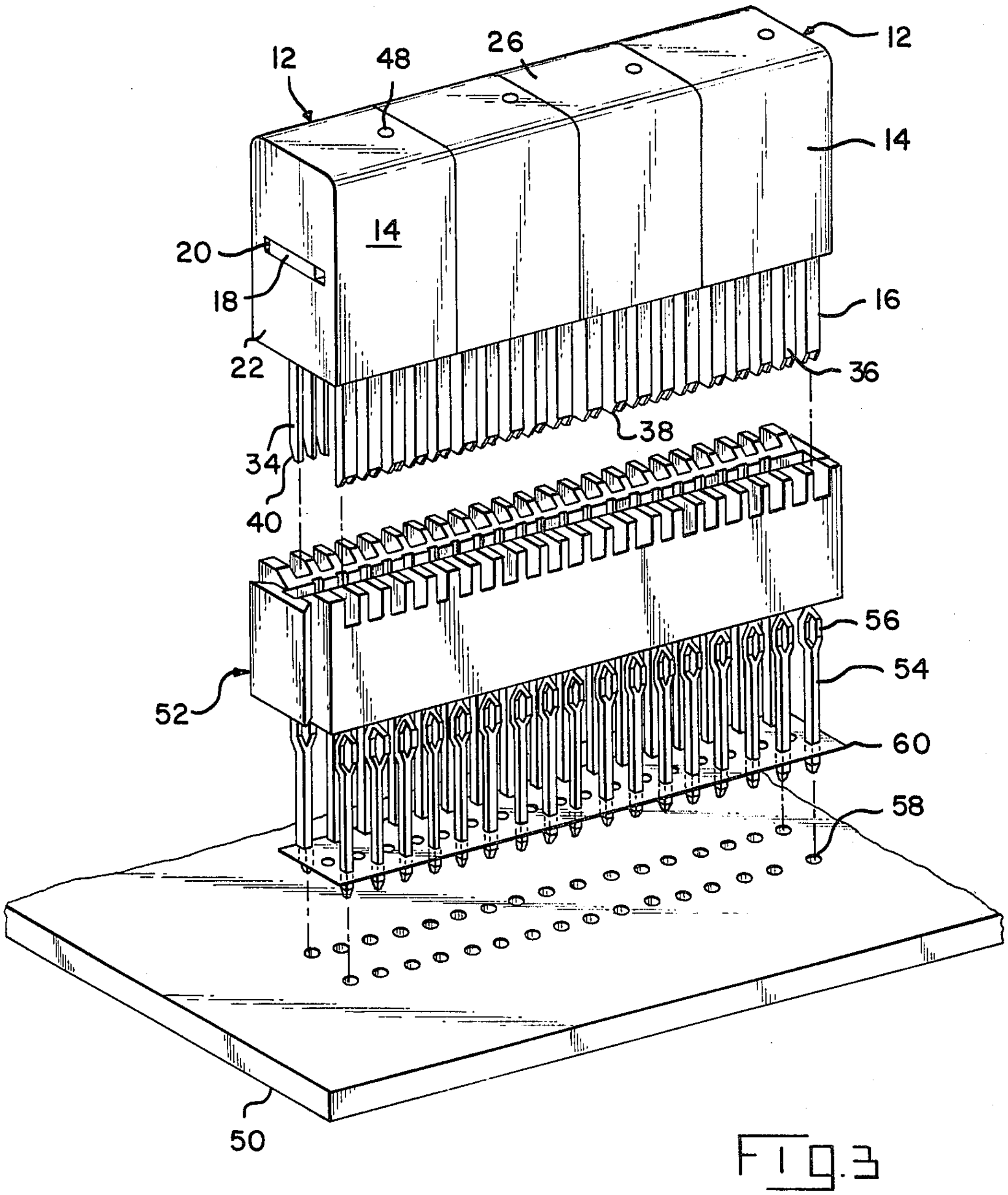
FIGS. 3, 4, and 5 illustrate the method of mounting a connector on a printed circuit board using the tool of FIG. 1.
Figure 4:
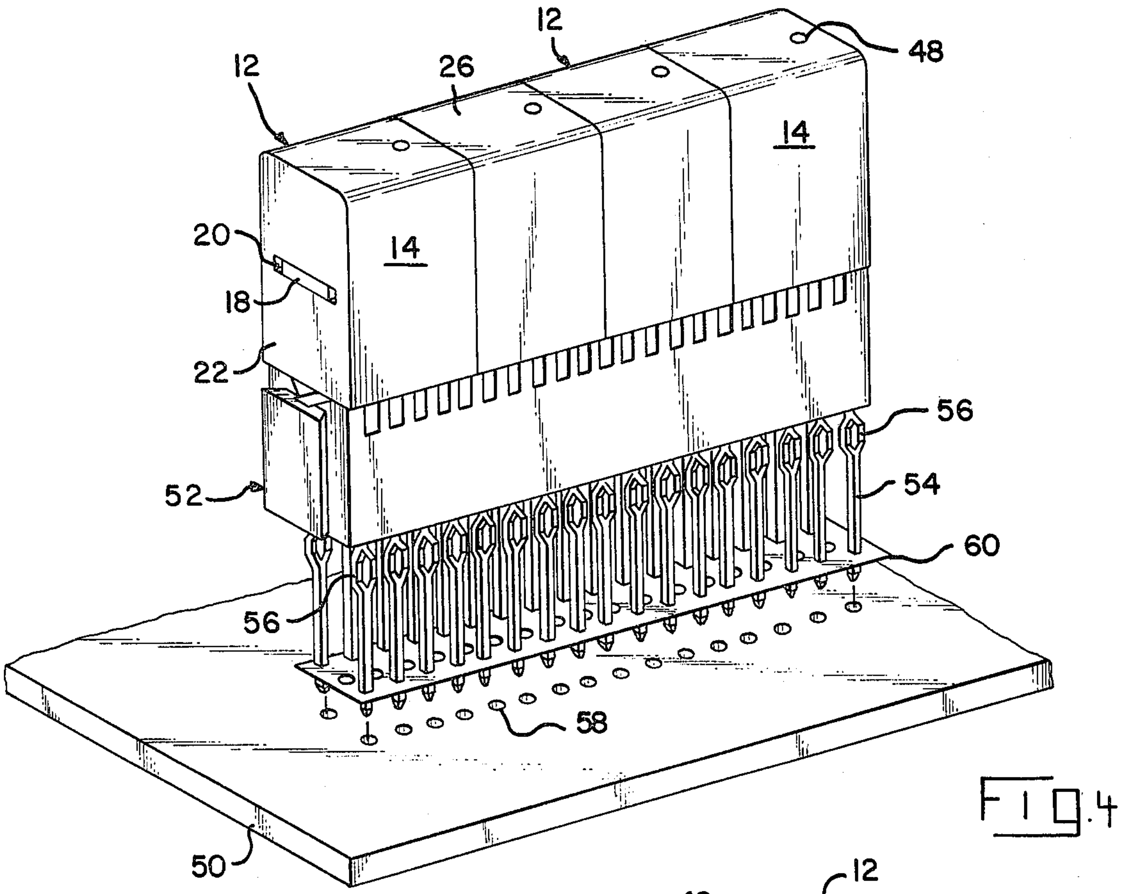
Figure 5:
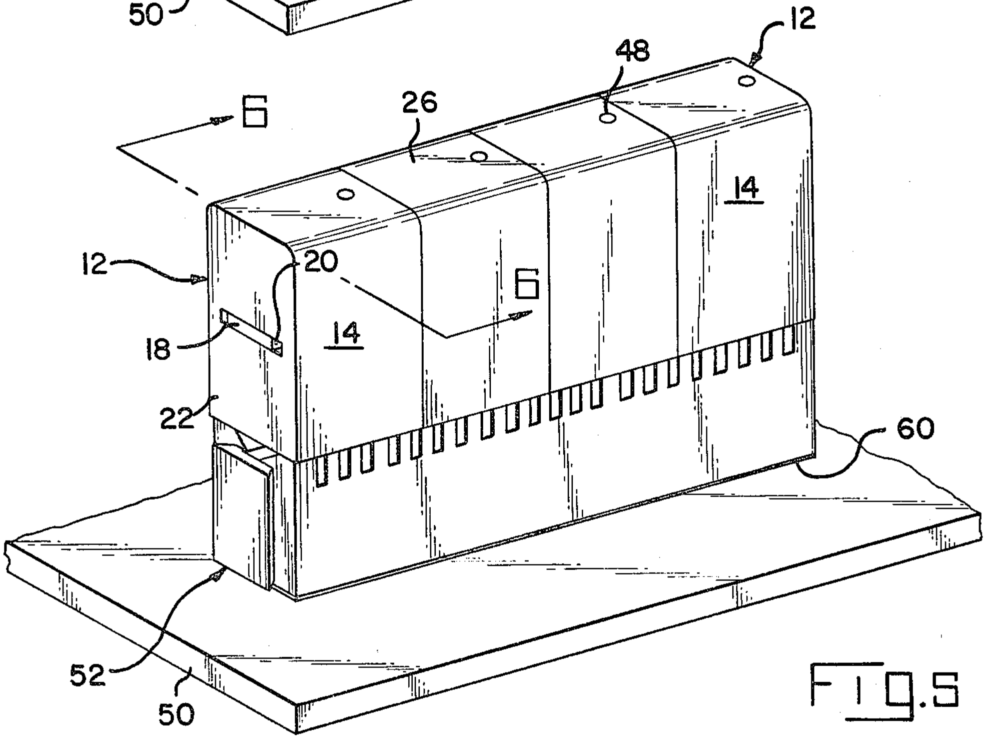

FIG. 3 shows push pins on tool 10 in alignment with the contacts in connector 52. FIG. 6 shows the tool positioned on the connector with the lower ends 38 on the push pins 16 bearing against contact shoulders 64 (FIG. 6). The lower part of card engaging members 62 are received in channels 32 of the push pins. After lining contact pins 54 up with holes 58, pressure is applied to tool 10, either manually or by a press (not shown) to drive the pins and particularly the spring sections 56 into the holes. FIGS. 5 and 6 show the connector mounted on the board; i.e., the spring sections 56 lodged in plated-through holes 58.

Figure 7:
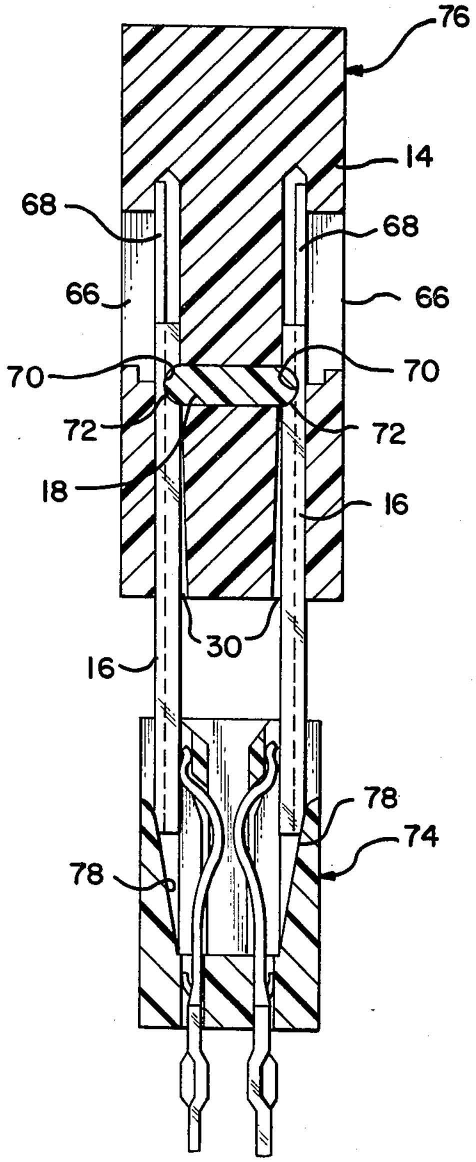
FIGS. 7 and 8 are cross-sectional views showing an alternate embodiment.
Figure 8:
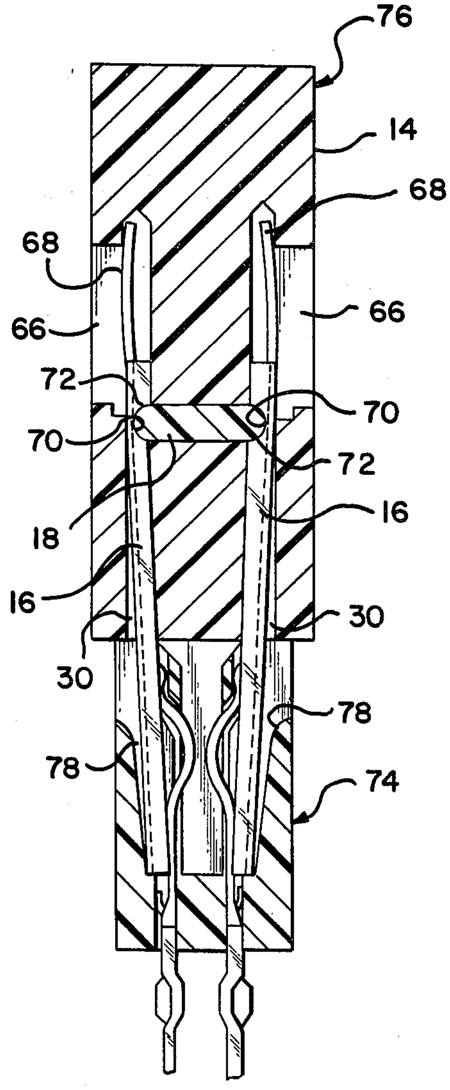

FIGS. 7 and 8 disclose an alternative embodiment. Modifications to the housing include lateral openings 66. The apertures 30 are wider near the housing undersurface and converge upwardly. The push pins are modified by removing at portion of sidewalls 34 adjacent the upper end 44 so that only a strap 68 remains. The notches 42 are rounded as indicated by reference numeral 70.

Retaining bar 18 has the edges rounded as indicated by reference numeral 72.

The alternative embodiment functions in card edge connectors 74 such as shown in FIGS. 7 and 8. These type connectors are smaller in width and the contacts are closer together. Accordingly, the alternative embodiment, indicated by reference numeral 76, may be used with such connectors because the push pins have a degree of longitudinal bending. As shown in FIG. 8, as the tool is placed onto connector 74, the push pins engage ribs 78 in the connector housing. These ribs cam the push pins inwardly as the tool is pushed down. The push pins can move inwardly because of the wider apertures 30, the rounded notches and retaining bar and the bending of strap 68 into lateral openings 66. As the tool is withdrawn from the connector, the forces accumulated in bending straps 68 spring the push pins back to the vertical.

The present invention may be subject to many modifications and changes without departing from the spirit or essential characteristics thereof. The present embodiment is therefore intended in all respects as being illustrative and not restrictive of the scope of the invention.

What is claimed is:

1. A tool for mounting a connector having depending contact pins into a printed circuit board, said tool comprising:

a. a housing having a slot extending longitudinally therethrough and two spaced apart rows of a plurality of spaced apart apertures extending vertically from above the slot to the underside of the housing with the apertures intersecting the slot;

b. a plurality of channel-shaped push pins having an arcuate-shaped notch adjacent an upper end and positioned in the apertures with the lower ends extending below the housing for insertion into a connector to engage contacts therein; and c. a bar having rounded edges positioned in the slot and passing through the arcuate-shaped notches in the push pins to retain the pins in the apertures and further to permit the pins to pivot laterally.

* * * * *